United States Patent [19]
Kimura

[11] Patent Number: 5,216,676
[45] Date of Patent: Jun. 1, 1993

[54] BCH CODE DECODER AND METHOD FOR DECODING A BCH CODE

[75] Inventor: Tomohiro Kimura, Takaishi, Japan

[73] Assignee: Matsushita Electric Industrial Co., Ltd., Osaka, Japan

[21] Appl. No.: 623,617

[22] Filed: Dec. 7, 1990

[30] Foreign Application Priority Data

Dec. 8, 1989 [JP] Japan .................. 1-319389

[51] Int. Cl.$^5$ .......................................... G06F 11/10
[52] U.S. Cl. .................. 371/37.1; 371/37.2; 371/41; 371/37.8
[58] Field of Search ............... 371/37.1, 37.2, 37.3, 371/37.4, 37.5, 37.6, 37.7, 37.8, 37.9, 41

[56] References Cited

U.S. PATENT DOCUMENTS

| | | | |
|---|---|---|---|
| 3,873,920 | 3/1975 | Apple, Jr. et al. | 371/37.1 |
| 4,013,997 | 3/1977 | Treadwell, III | 371/37.1 |
| 4,556,977 | 12/1985 | Olderdissen et al. | 371/37.1 |
| 4,694,455 | 9/1987 | Koga | 371/37.1 |
| 4,751,704 | 6/1988 | Kojima | 371/37.2 |
| 5,051,999 | 9/1991 | Erhart et al. | 371/41 |

FOREIGN PATENT DOCUMENTS

| | | |
|---|---|---|
| 0112676A3 | 9/1983 | European Pat. Off. |
| 63-254829 | 10/1988 | Japan |
| 64-29123 | 1/1989 | Japan |
| 64-29124 | 1/1989 | Japan |
| 64-29125 | 1/1989 | Japan |
| 2093238A | 7/1981 | United Kingdom |

OTHER PUBLICATIONS

"Double-Error Correction", M. Y. Hsiao et al., IBM Technical Disclosure Bulletin vol. 14, No. 4, Sep. 1971.
"High-speed hardware decoder for double-error-correcting binary BCH codes", Shyue-Win Wei et al., IEE Proceedings, vol. 136, Pt. I., No. 3, Jun. 1989, pp. 227-231.
Y. R. Shayan et al., "Binary-decision approach to fast Chien search for software decoding of BCH codes", IEEEE Proceedings, vol. 134, Pt. F, No. 6 Oct. 1987, pp. 629-632.
Yousef R. Shayan et al., "A fast software decoding algorithm for binary double error correcting BCH codes", Globecom '87, 52.6.1-5.
A. Katsaros, "Decoding of the (15, 7) and (31, 21) binary BCH codes", Int. J. Electronics, 1988, vol. 64, No. 4, pp. 637-640.
A. Katsaros, "Fast decoders for double-error-correcting binary BCH codes", Int. J. Electronics, 1988, vol. 65, No. 6, pp. 1077-1083.

Primary Examiner—Robert W. Beausoliel, Jr.
Assistant Examiner—Dieu-Minh Le
Attorney, Agent, or Firm—Wenderoth, Lind & Ponack

[57] ABSTRACT

In a BCH code decoder for correcting a natural number N of error bits occurring in a code sequence composed of bits encoded by a BCH encoding method, and a method therefor, first to N-th syndromes are respectively generated from an inputted code sequence encoded by the BCH encoding method, and first to N-th check codes are respectively generated by subtracting predetermined syndromes to be calculated when an error occurs at a predetermined bit of said code sequence from said first to N-th syndromes. Thereafter, error correction information is generated when a number of error bits represented by said first to N-th syndromes is equal to the sum of one and a number of error bits represented by said first to N-th check codes, and one or more error bits of said inputted code sequence are corrected according to said error correction information, thereby outputting the decoded code sequence.

6 Claims, 5 Drawing Sheets

BCH CODE DECODER AND METHOD FOR DECODING A BCH CODE

BACKGROUND OF THE INVENTION

1. Field of the Invention

The present invention relates to a Bose-ChaudhuriHocquenghem code (referred to as a BCH code hereinafter) decoder and a method for decoding a BCH code, and more particularly, to a BCH code decoder for correcting a natural number N or less of error bits occurring in a code sequence composed of bits encoded by a BCH encoding method, and a method for decoding a BCH code so as to correct a natural number N or less of error bits occurring in a code sequence composed of bits encoded by a BCH encoding method.

2. Description of the Related Art

Conventionally, in order to correct one or more bit errors occurring in digital data upon transmitting the digital data, a method has been used such that digital data composed of an information sequence to which a check sequence is added on a transmission side are transmitted, and bit errors occurring in digital data upon transmitting them are corrected by a error correction unit on a reception side. As one of error correction codes for obtaining the above-mentioned check sequence, the BCH code has been used.

FIG. 1 shows a conventional BCH code decoder which is well known to those in the art (For example, see Toshihide HABUTSU, "Error correction by the BCH code", Hohsoh gijutsu, November 1983, pp 1111). The composition of the conventional BCH decoder will be described below with reference to FIG. 1.

Referring to FIG. 1, a code sequence composed of an information sequence and a check sequence which is coded by the BCH code is inputted in a serial form through an input terminal 111 to a syndrome generator 101 and a delay circuit 108. The syndrome generator 101 generates a syndrome based on a check matrix of the BCH code from the code sequence inputted through the input terminal 111, and outputs the generated syndrome to a syndrome memory 102. The syndrome memory 102 temporarily stores the generated syndrome at a timing when the generation of the syndrome performed by the syndrome generator 101 has been completed, and outputs the stored syndrome to a code converter 103.

The code converter 103 of a read only memory (referred to as a ROM hereinafter) converts the syndrome inputted from the syndrome memory 102 into signals for representing different error bit positions of one or two bit errors to coincidence judgment circuits 105 and 106, respectively. Data of bit error positions corresponding to all the syndromes previously obtained in respective error patterns with respect to all the bit errors of two bits or less are stored at the addresses which are respectively the same as the above syndromes in the ROM of the code converter 103. When the syndrome temporarily stored in the syndrome memory 102 is inputted to an address terminal of the ROM of the code converter 103, data of the bit error positions corresponding to the inputted syndrome are outputted from a data terminal thereof.

The delay circuit 108 delays the code sequence inputted through the input terminal 111 by a predetermined delay time, and sequentially outputs them to a first input terminal of an exclusive OR gate 109, which is provided for inverting a bit inputted from the delay circuit 108 only when the inputted bit is an error bit. A counter 107 generates a signal representing a bit position of the delayed code sequence which is outputted from the delay circuit 108 in synchronization with the delayed code sequence by counting a clock of the code sequence, and outputs the generated signal to both coincidence judgment circuits 105 and 106.

The coincidence judgment circuit 105 compares the error bit position outputted from the code converter 103 with the signal for representing the bit position of the code sequence which is outputted from the counter 107. Then, when the error bit position coincides with the bit position of the code sequence, the coincidence judgment circuit 105 outputs an error correction signal having a high level to a first input terminal of an OR gate 110. On the other hand, when the error bit position does not coincide with the bit position of the code sequence, the coincidence judgment circuit 105 outputs the error correction signal having a low level to the first input terminal of the OR gate 110.

The coincidence judgment circuit 106 generates an error correction signal by comparing the error bit position outputted from the code converter 103 with the signal representing the bit position of the code sequence which is outputted from the counter 107 in a manner similar to that of the coincidence judgment circuit 105, and then, outputs the generated error correction signal to the second input terminal of the OR gate 110.

The OR gate 110 calculates the logical sum of the error correction signal inputted from the coincidence judgment circuit 105 and the error correction signal inputted from the coincidence judgment circuit 106, and outputs a signal of the logical sum to the second input terminal of the exclusive OR gate 109. The exclusive OR gate 109 calculates the exclusive logical sum of the signals inputted from the delay circuit 108 and the OR gate 110, namely inverts a bit inputted from the delay circuit 108 only when the inputted bit is an error bit, and outputs the signal of the exclusive logical sum to an output terminal 112.

The action of the conventional BCH decoder shown in FIG. 1 is described below.

When a transmitted code sequence is inputted in a serial form through the input terminal 111, a syndrome is generated from the inputted code sequence by the syndrome generator 101, and then, the generated syndrome is temporarily stored in the syndrome memory 102. Thereafter, the syndrome stored in the syndrome memory 102 is converted into signals of the error bit positions of the error bits occurring in the code sequence by the code converter 103. Simultaneously, the code sequence is inputted to the delay circuit 108, and then, the delay circuit 108 delays the inputted code sequence by the predetermined delay time and outputs the delayed code sequence to the exclusive OR gate 109. At that time, the counter 107 is started, and then, the counter 107 generates a signal representing a bit position of the delayed code sequence which is outputted from the delay circuit 108 in synchronization with the delayed code sequence by counting a clock of the code sequence, and outputs the signal to both coincidence judgment circuits 105 and 106.

The coincidence judgment circuits 105 and 106 respectively compare the different error bit positions outputted from the code converter 103 with the bit position of the code sequence represented by the signal which is generated by the counter 107. When either one of the coincidence judgment circuits 105 and 106 judges that the error bit position outputted from the code converter 103 coincides with the bit position of the code sequence represented by the above-mentioned signal, an error correction signal having an high level is outputted from the OR gate 110 to the exclusive OR gate 109. The exclusive OR gate 109 inverts the bit of the code sequence outputted from the delay circuit 108 if the error correction signal becomes a high level. Therefore, one or two error bits included the code sequence are corrected, and then, the code sequence composed of only the correct bits when the number of the error bits is two or less is outputted as the decoded code sequence from the exclusive OR gate 109 to the output terminal 112.

However, in the BCH decoder constructed as described above, it is necessary for the ROM of the code converter 103 to have the addresses of a bit number which is the same as the number of all of syndrome, and it is also necessary for data of a bit number representing all the error bit positions to be stored at these addresses in the ROM of the code converter 103. Therefore, the memory capacity of the ROM of the code converter 103 becomes extremely large, and then, there is a problem in that the circuit size of the BCH decoder is enlarged.

Further, as the code length of the code used for the error correction becomes longer, the necessary memory capacity of the ROM of the code converter 103 exponentialfunctionally increases depending on the code length, and then, the circuit size of the decoder is extremely enlarged, resulting in difficulty of realizing the decoder.

For example, in the case of a BCH (15, 7) code having a code length of 15 bits and a length of a information code of 7 bits, the bit number of the syndrome is eight, and the number of the addresses of the ROM is eight. Further, it is necessary to store data of eight bits at one address of the ROM in order to represent information of two positions in the code having a code length of 15. As a result, it is necessary to provide a ROM having a memory capacity of 2048 ($=8 \times 2^8$) bits.

Furthermore, in the case of a BCH (255, 239) code, it is necessary to provide a ROM having a memory capacity of 1048576 bits.

Since it is necessary to provide storage means such as a ROM, there is such a problem that it is difficult to construct the entire BCH decoder using an LSI chip.

SUMMARY OF THE INVENTION

An essential object of the present invention is to provide a BCH code decoder capable of correcting N or less error bits occurring in a code sequence encoded by a BCH encoding method, which can be miniaturized as compared with the conventional BCH code decoder. It is to be noted that N is a natural number, hereinafter.

Another object of the present invention is to provide a method for decoding a BCH code capable of correcting N or less error bits occurring in a code sequence encoded by a BCH encoding method, in a manner more simple than that of the conventional method for decoding the BCH code.

A further object of the present invention is to provide a BCH code decoder capable of correcting two or less error bits occurring in a code sequence encoded by a BCH encoding method, which can be constructed using logical operation circuits and also can be miniaturized as compared with the conventional BCH code decoder.

A still further object of the present invention is to provide a method for decoding a BCH code capable of correcting two or less error bits occurring in a code sequence encoded by a BCH encoding method, in a simpler manner than that of the conventional method for decoding the BCH code.

In order to accomplish the above objects, according to one aspect of the present invention, there is provided a BCH code decoder for correcting a natural number N or less of error bits occurring in a code sequence composed of bits encoded by a BCH encoding method, comprising:

first to N-th syndrome generating means for respectively generating first to N-th syndromes from an inputted code sequence encoded by the BCH encoding method first to N-th subtracting means for respectively generating first to N-th check codes by subtracting predetermined syndromes to be calculated when an error occurs at a predetermined bit of said code sequence from said first to N-th syndromes generated by said first to N-th syndrome generating means;

a first error number judging means for judging a number of error bits represented by said first to N-th syndromes respectively generated by said first to N-th syndrome generating means, and for outputting a signal representing the judged number thereof;

a second error number judging means for judging a number of error bits represented by said first to N-th check codes respectively generated by said first to N-th subtracting means and for outputting a signal representing the judged number thereof;

an error number comparing means for generating an error correction signal when the judged number of said signal outputted from said first error number judging means is equal to the sum of one and the judged number of said signal outputted from said second error number judging means by comparing the judged number of said signal outputted from said first error number judging means with the judged number of said signal outputted from said second error number judging means;

a delay means for delaying said inputted code sequence by a predetermined delay time and for sequentially outputting a delayed code sequence; and an error bit correcting means for inverting each bit of said delayed code sequence outputted from said delay means and for outputting each inverted bit when said error correction signal is inputted from said error number comparing means and for outputting each bit of said delayed code sequence outputted from said delay means as is without inverting it when said error correction signal is not inputted from said error number comparing means, thereby outputting the decoded and corrected code sequence.

According to another aspect of the present invention, there is provided a BCH code decoder for correcting two or less error bits occurring in a code sequence composed of bits encoded by a BCH encoding method, comprising:

first and second syndrome generating means for respectively generating first and second syndromes from an inputted code sequence encoded by the BCH encoding method first and second subtracting means for respectively generating first and second subtraction codes by subtracting predetermined syndromes to be calculated when an error occurs at a predetermined bit of said code sequence from said first and second syndromes generated by said first and second syndrome generating means;

a non-zero detecting means for outputting a first judgment signal when at least one bit of said first syndrome generated by said first syndrome generating means is not zero in response to said first syndrome;

a cube calculating means for calculating the cube of said first subtraction code generated by said first subtracting means and outputting a cubic code of the calculated cube of said first subtraction code;

a coincidence judgment means for outputting a second judgment signal when said cubic code outputted from said cube calculating means coincides with said second subtraction code outputted from said second subtracting means by comparing said cubic code outputted from said cube calculating means with said second subtraction code outputted from said second subtracting means;

a gate means for outputting an error correcting signal when said first judgment signal is outputted from said non-zero detecting means and said second judgment signal is outputted from said coincidence judgment means;

a delay means for delaying said inputted code sequence by a predetermined delay time and for sequentially outputting a delayed code sequence; and an error bit correcting means for inverting each bit of said delayed code sequence outputted from said delay means and for outputting an inverted bit when said error correction signal is inputted from said gate means and for outputting each bit of said delayed code sequence outputted from said delay means as is without inverting it when said error correction signal is not inputted from said gate, thereby outputting the decoded and corrected code sequence.

According to a further aspect of the present invention, there is provided a BCH code decoder for correcting two or less error bits occurring in a code sequence composed of bits encoded by a BCH encoding method, comprising:

first and second syndrome generating means for respectively generating first and second syndromes from an inputted code sequence encoded by the BCH encoding method;

a first subtracting means for generating a first subtraction code by subtracting a predetermined syndrome to be calculated when an error occurs at a predetermined bit of said code sequence from said first syndrome generated by said first syndrome generating means;

a non-zero detecting means for outputting a first judgment signal when at least one bit of said first syndrome generated by said first syndrome generating means is not zero in response to said first syndrome;

a cube calculating means for calculating the cube of said first subtraction code generated by said first subtracting means and for outputting a cubic code of the calculated cube of said first subtraction code;

an adding means for adding a predetermined syndrome to be outputted from said second syndrome generating means when an error occurs at a predetermined bit of said code sequence, to said cubic code outputted from said cube calculating means, and for outputting an addition code of the addition result;

a coincidence judgment means for outputting a second judgment signal when said addition code outputted from said adding means coincides with said second syndrome outputted from said second syndrome generating means by comparing said addition code outputted from said adding means with said second syndrome outputted from said second syndrome generating means;

a gate means for outputting an error correcting signal when said first judgment signal is outputted from said non-zero detecting means and said second judgment signal is outputted from said coincidence judgment means;

a delay means for delaying said inputted code sequence by a predetermined delay time and for sequentially outputting a delayed code sequence; and an error bit correcting means for inverting each bit of said delayed code sequence outputted from said delay means and for outputting an inverted bit when said error correction signal is inputted from said gate means and for outputting each bit of said delayed code sequence outputted from said delay means as is without inverting it when said error correction signal is not inputted from said gate means, thereby outputting the decoded and corrected code sequence.

According to a still further aspect of the present invention, there is provided a method for decoding a BCH code so as to correct a natural number N or less of error bits occurring in a code sequence composed of bits encoded by a BCH encoding method, including steps of:

respectively generating first to N-th syndromes from an inputted code sequence encoded by the BCH encoding method;

respectively generating first to N-th check codes by subtracting predetermined syndromes to be calculated when an error occurs at a predetermined bit of said code sequence from said first to N-th syndromes;

generating error correction information when a number of error bits represented by said first to N-th syndromes is equal to a sum obtained by adding one to a number of error bits represented by said first to N-th check codes; and correcting one or more error bits of said inputted code sequence according to said error correction information.

According to still further aspect of the present invention, there is provided a method for decoding a BCH code so as to correct two or less error bits occurring in a code sequence composed of bits encoded by a BCH encoding method, including the steps of:

respectively generating first and second syndromes from an inputted code sequence encoded by the BCH encoding method;

respectively generating first and second subtraction codes by subtracting predetermined syndromes to be calculated when an error occurs at a predetermined bit of said code sequence from said first and second syndromes;

generating error correction information when at least one bit of said first syndrome is not zero and a cube of said first subtraction code coincides with said second subtraction code; and correcting one or more error bits of said inputted code sequence according to said error correction information.

According to still a further aspect of the present invention, there is provided a method for decoding a BCH code so as to correct two or less error bits occurring in a code sequence composed of bits encoded by a BCH encoding method, including the steps of:

respectively generating first and second syndromes from an inputted code sequence encoded by the BCH encoding method generating a first subtraction code by subtracting a predetermined syndrome to be calculated when an error occurs at a predetermined bit of said code sequence from said first syndrome;

generating a cubic code by cubing said first subtraction code;

generating an addition code by adding a predetermined second syndrome to be calculated when an error occurs at a predetermine bit of said code sequence to said cubic code;

generating error correction information, when at least one bit of said first syndrome is not zero and said addition code coincides with said second syndrome; and correcting one or more error bits of said inputted code sequence according to said error correction information.

BRIEF DESCRIPTION OF THE DRAWINGS

These and other objects and features of the present invention will become clear from the following description taken in conjunction with the preferred embodiments thereof with reference to the accompanying drawings, in which.

DETAILED DESCRIPTION OF THE PREFERRED EMBODIMENTS

Preferred embodiments according to the present invention will be described below with reference to the attached drawings.

(1) BCH Code

First of all, a BCH code capable of correcting N or less error bits will be described below, wherein N is a natural number.

The BCH code capable of correcting N or less error bits is composed of code bits of roots which are elements of $\alpha, \alpha^3, \ldots, \alpha^{2N-1}$ of the Galois field GF ($2^m$), and has a code length of n ($=2^m - 1$) bits, wherein m and n are natural numbers, respectively. In the present specification, respective calculations described hereinafter are performed over the Galois field GF ($2^m$).

Namely, in the case of the following code sequence $$R = [a_1, a_2, \ldots, a_{n-1}, a_n] \tag{1}$$

the above code sequence R including the following N check matrixes:

$$H_1 = [\alpha^{n-1}, \alpha^{n-2}, \ldots, \alpha^1, \alpha^0] \tag{2a}$$
$$H_3 = [\alpha^{3(n-1)}, \alpha^{3(n-2)}, \ldots, \alpha^3, \alpha^0] \tag{2b}$$

$$H_{2N-1} = [\alpha^{(2N-1)(n-1)}, \alpha^{(2N-1)(n-2)}, \ldots, \alpha^{(2N-1)}, \alpha^0] \tag{2c}$$

is encoded so as to establish the following equations:

$$H_1 R^T = 0 \tag{3a}$$
$$H_3 R^T = 0 \tag{3b}$$

$$H_{2N-1} R^T = 0. \tag{3c}$$

If a code sequence R' when one or more error bits occur therein is represented as follows:

$$R' = [a_1', a_2', \ldots, a_{n-1}', a_n'] \tag{4}$$

the above code sequence R' is represented by the following equation:

$$R' = R + E \tag{5}$$

where an error sequence E is represented by the following equation:

$$\begin{aligned} E &= [e_1, e_2, \ldots, e_{n-1}, e_n] & (6) \\ a_k' &= a_k + e_k, \text{ for } 1 \leq \text{ a natural number } k \leq n & (7) \\ e_k &= 1, \text{ for an error bit} & (8a) \\ &= 0, \text{ for a correct bit or non-error bit.} & (8b) \end{aligned}$$

It is to be noted that the error code sequence R' includes the non-error code sequence R when E = [0, 0, . . ., 0], hereinafter, as is apparent from the equations (5) to (7), (8a) and (8b).

Further, N syndromes $S_1, S_3, \ldots, S_{2N-1}$ are obtained based on the N check matrixes $H_1, H_3, \ldots, H_{2N-1}$ from the error code sequence R' as follows:

$$\begin{aligned} S_1 &= H_1 R'^T \\ &= H_1 R^T + H_1 E^T \end{aligned} \tag{9a}$$

-continued
$$= H_1 E^T$$
$$S_3 = H_3 E^T \tag{9b}$$
$$\vdots$$
$$S_{2N-1} = H_{2N-1} E^T. \tag{9c}$$

In the first to the fourth preferred embodiments, a syndrome $S_K \alpha^{k-1}$ ($K = 1, 3, \ldots, 2N-1$ and $k = 1, 2, \ldots, n$) is referred as a syndrome $S_{K,k}$ generated in a k-th bit timing upon processing the code sequence, as described in detail later. Further, a group of syndromes $S_1$, $S_1 \alpha, \ldots, S_1 \alpha^{n-1}$ is referred to as first syndromes, a group of syndromes $S_3, S_3 \alpha, \ldots, S_3 \alpha^{n-1}$ is referred to as second syndromes, ..., and a group of syndromes $S_{2N-1}, S_{2N-1} \alpha, \ldots, S_{2N-1} \alpha^{n-1}$ is referred to as N-th syndromes.

(2) First Preferred Embodiment

Figure 1:
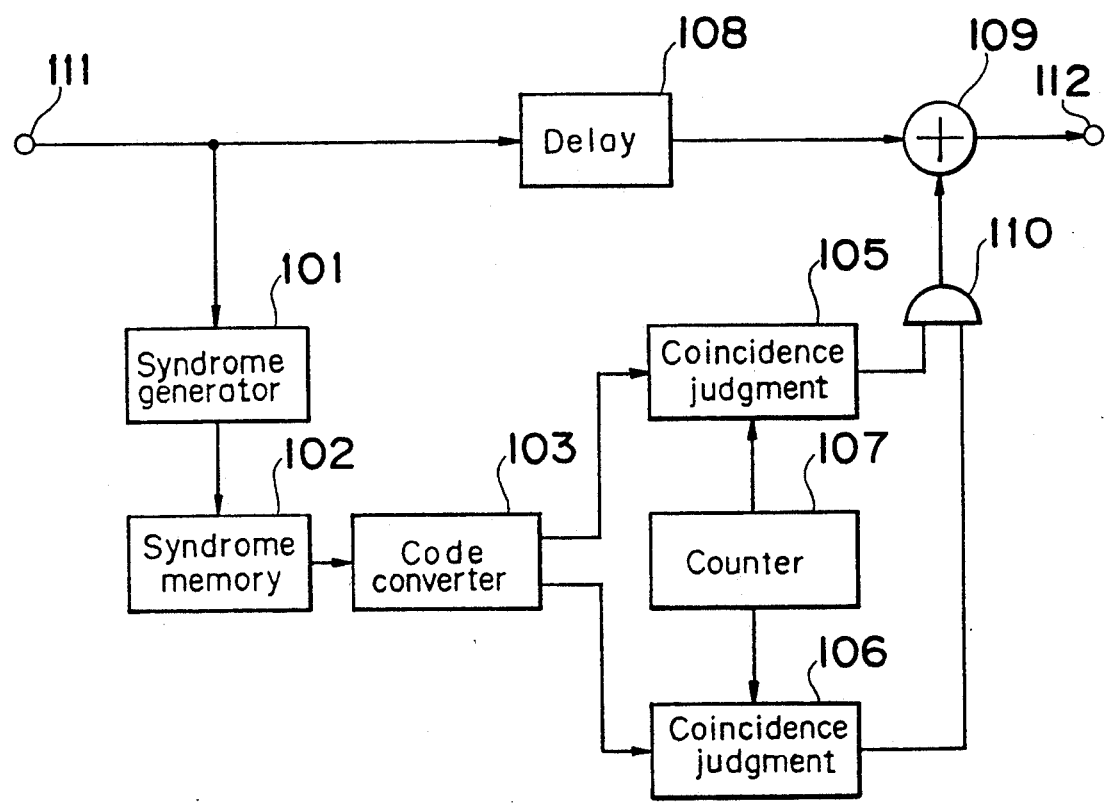
FIG. 1 is a block diagram showing a conventional BCH code decoder capable of correcting two or less error bits occurring in a code sequence encoded by a BCH encoding method.
Figure 2:
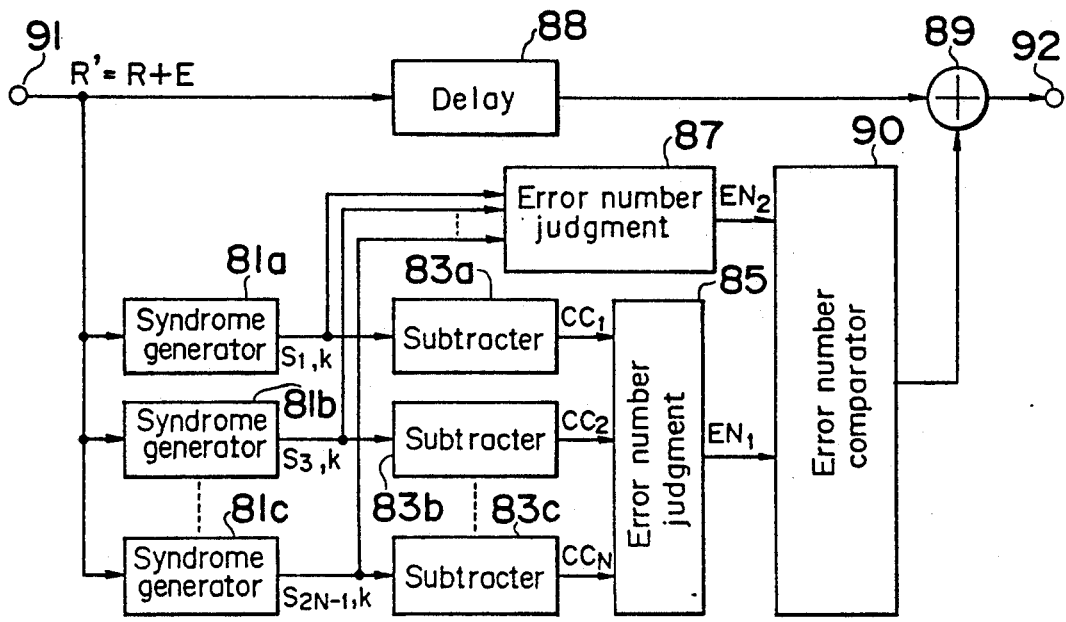
FIG. 2 is a block diagram showing a BCH code decoder in accordance with a first preferred embodiment of the present invention, which is capable of correcting N or less error bits occurring in a code sequence encoded by a BCH encoding method.

FIG. 2 is a block diagram showing a BCH code decoder in accordance with the first preferred embodiment of the present invention, which is capable of correcting N or less error bits occurring in a code sequence encoded by a BCH encoding method.

Referring to FIG. 2, a code sequence R' of the BCH code having a code length of n is inputted in a serial form through an input terminal 91 to a delay circuit 88 and syndrome generators 81a to 81c. The syndrome generators 81a, 81b, ..., and 81c generate the syndromes $S_{1,k}, S_{2,k}, \ldots, S_{2N-1,k}$ in a k-th bit timing among the code sequence based on the check matrixes $H_1, H_3, \ldots, H_{2N-1}$ in response to the code sequence R' and output them to subtracters 83a to 83c and an error number judgment circuit 87, respectively.

The subtracters 83a to 83c subtract $\alpha^{(n-1)}, \alpha^{3(n-1)}, \ldots, \alpha^{(2N-1)(n-1)}$ from the inputted syndromes $S_{1,k}, S_{2,k}, \ldots, S_{2N-1,k}$, respectively, and output the first and the second to the n-th check codes $CC_1, CC_2, \ldots, CC_N$ of the subtraction results to the error number judgment circuit 85, respectively. The above values $\alpha^{(n-1)}, \alpha^{3(n-1)}, \ldots, \alpha^{(2N-1)(n-1)}$ to be subtracted in the subtracters 83a to 83c respectively correspond to syndromes generated when $e_1 = 1$, and in this case, they are the values of the first row of the check matrixes $H_1, H_3, \ldots, H_{2N-1}$ when $e_1 = 1$. It is to be noted that the values to be subtracted therein are changed depending on the BCH code to be used in a manner well known to those skilled in the art.

The error number judgment circuit 85 judges the number of error bits (referred to as an error number hereinafter) represented by the first and the second to the N-th check codes $CC_1, CC_2, \ldots, CC_N$ in a manner well known to those skilled in the art, and outputs a signal for representing the error number $EN_1$ thereof to an error number comparator 90. On the other hand, the error number judgment circuit 87 judges the error number represented by the first and the second to the N-th syndromes $S_{1,k}, S_{2,k}, \ldots, S_{2N-1,k}$ in a manner well known to those skilled in the art, and outputs a signal for representing the error number $EN_2$ thereof to the error number comparator 90.

The error number comparator 90 compares the error number $EN_1$ with the error number $EN_2$ in response to the signals inputted from the error number judgment circuits 85 and 87. If $EN_2 = EN_1 + 1$, the error number comparator 90 outputs an error correction signal having a high level to the second input terminal of an exclusive OR gate 89. Otherwise, the error number comparator 90 outputs an error correction signal having a low level.

On the other hand, the delay circuit 88 delays the code sequence R' inputted through the input terminal 91 by a predetermined delay time of one BCH code, and outputs it to the first input terminal of the exclusive OR gate 89, sequentially. The exclusive OR gate 89 calculates the exclusive logical sum of the signals inputted from the delay circuit 88 and the error number comparator 90, namely it inverts a bit inputted from the delay circuit 88 only when the inputted bit is an error bit, namely, the error correction signal becomes a high level, and then, outputs the signal of the exclusive logical sum thereof to an output terminal 92.

Therefore, one or more error bits up to the N bit error bits included the error code sequence R' are corrected, and then, the decoded code sequence composed of only the corrected bits when the number of the error bits is N or less is outputted from the exclusive OR gate 89 to the output terminal 92.

(3) Second Preferred Embodiment

Figure 3:
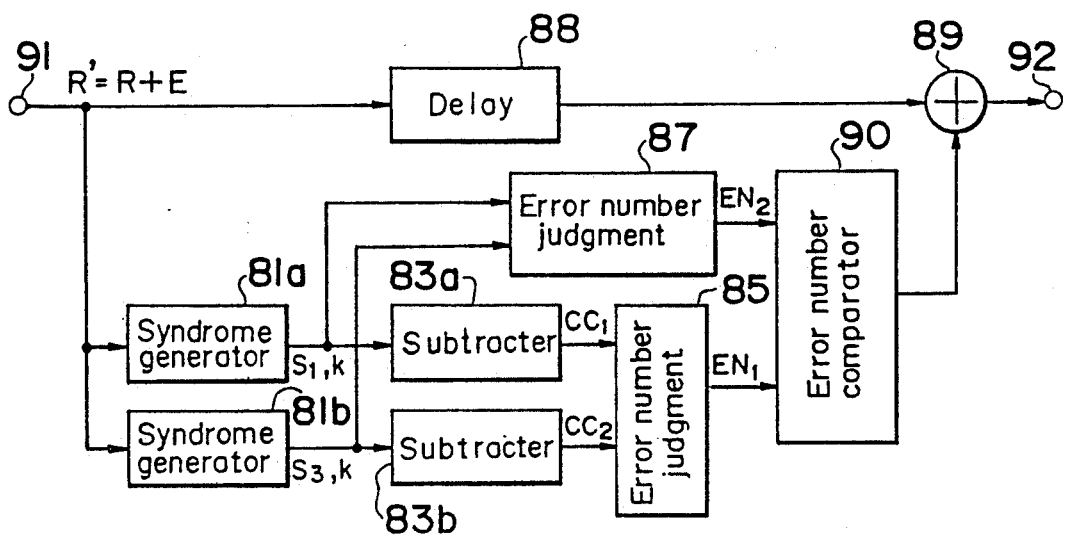
FIG. 3 is a block diagram showing a BCH code decoder in accordance with a second preferred embodiment according to the present invention, which is capable of correcting two or less error bits occurring in a code sequence encoded by a BCH encoding method.

FIG. 3 is a block diagram showing a BCH code decoder in accordance with the second preferred embodiment of the present invention, which is capable of correcting two or less error bits occurring in a code sequence encoded by a BCH encoding method. In FIG. 3, the components which are the same as those shown in FIG. 2 are denoted by the numerals which are the same as those shown in FIG. 2.

In the case of the BCH decoder of the second preferred embodiment, the error number judgment circuit 85 judges the error number represented by the first and the second check codes $CC_1$ and $CC_2$, and outputs a signal for representing the error number $EN_1$ thereof to the error number comparator 90. On the other hand, the error number judgment circuit 87 judges the error number represented by the first and the second syndromes $S_1$ and $S_3$, and outputs a signal for representing the error number $EN_2$ thereof to the error number comparator 90. Thereafter, the error number comparator 90 outputs the error correction signal having a high level to the exclusive OR gate 89, if the error number $EN_2$ of the signal outputted from the error number judgment circuit 87 is one and the error number $EN_1$ of the signal outputted from the error number judgment circuit 85 is zero, or the error number $EN_2$ is two and the error number $EN_1$ is one. Otherwise, the error number comparator 90 outputs a error correction signal having a low level.

Therefore, one or two error bits included the error code sequence R' are corrected, and then, the decoded code sequence composed of only the corrected bits when the number of the error bits is two or less is outputted from the exclusive OR gate 89 to the output terminal 92.

(4) Third Preferred Embodiment

Figure 4:
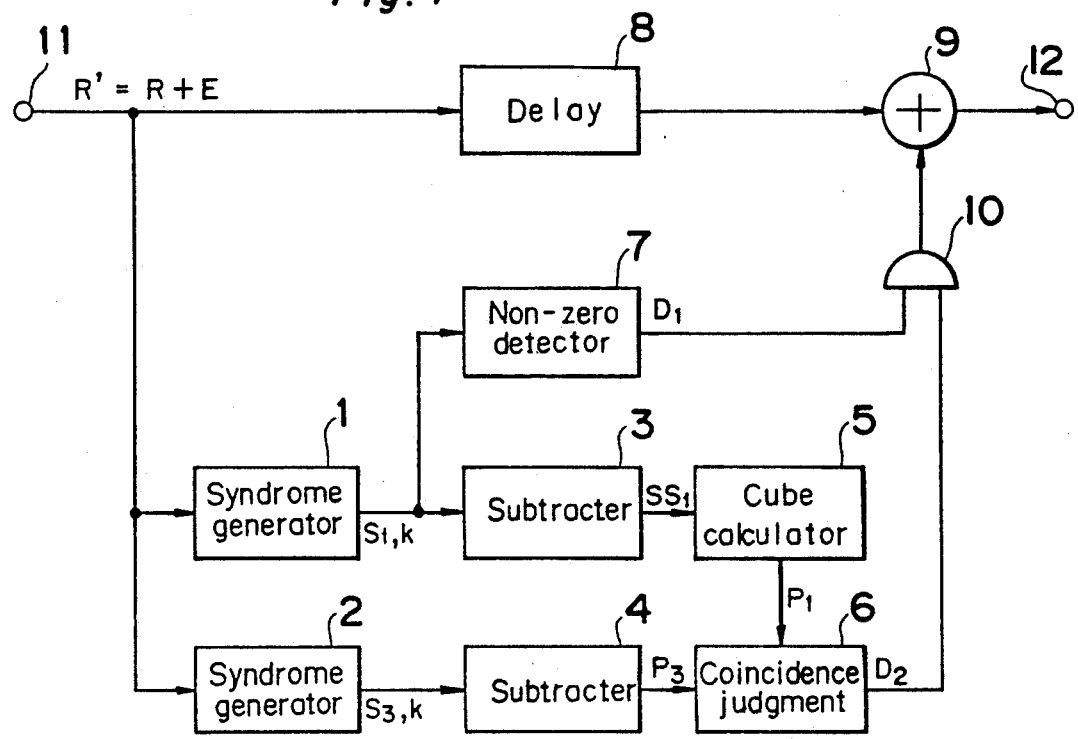
FIG. 4 is a block diagram showing a BCH code decoder in accordance with a third preferred embodiment of the present invention, which is capable of correcting two or less error bits occurring in a cod sequence encoded by a BCH encoding method.

FIG. 4 is a block diagram showing a BCH code decoder in accordance with the third preferred embodiment of the present invention, which is capable of correcting two or less error bits occurring in a code sequence encoded by a BCH encoding method.

The composition of the BCH decoder of the third preferred embodiment and the action thereof when errors occur in the i-th and j-th bits among the code sequence R, namely $e_i = 1$, $e_j = 1$ and $e_k = 0$ ($1 \leq k \leq n$ and $k \neq i$, $k \neq j$) are described below with reference to FIG. 4.

Referring to FIG. 4, a code sequence R' of the BCH code is inputted in a serial form through an input terminal 11 to a delay circuit 8 and syndrome generators 1 and 2. In response to the code sequence R', the syndrome generator 1 generates the first syndrome $S_{1,k}$ in a k-th bits timing among the code sequence R' based on the check matrix $H_1$. For example, in response to the first bit $a_1'$ of the code sequence R', the syndrome generator 1 generates the following syndrome $S_1$:

$$S_1 = H_1 R'^T \qquad (10)$$
$$= \alpha^{n-i} + \alpha^{n-j},$$

which is outputted to a subtracter 3 and a non-zero detector 7.

Further, in response to the code sequence R', the syndrome generator 2 generates the second syndrome $S_{3,k}$ in a k-th bit timing based on the check matrix $H_3$. For example, in response to the first bit al' of the code sequence R', the syndrome generator 2 generates the following syndrome $S_3$:

$$S_3 = H_3 R'^T \qquad (11)$$
$$= \alpha^{3(n-i)} + \alpha^{3(n-j)},$$

which is outputted to a subtracter 4.

On the other hand, the delay circuit 8 delays the code sequence R' inputted through the input terminal 11 by a predetermined delay time of one BCH code, and outputs it to the first input terminal of an exclusive OR gate 9. At a timing when the whole code sequence R' has been completely inputted to the delay circuit 8, the first bit $a_1'$ of the code sequence R' is outputted from the delay circuit 8, and then, the syndromes $S_1$ and $S_3$ are outputted from the syndrome generators 1 and 2.

Thereafter, the BCH code decoder starts in an error correction process. In the time interval while performing the error correction process, data of zero are always inputted in a serial form through the input terminal 11 to the delay circuit 8 and the syndrome generators 1 and 2, and the syndrome generators 1 and 2 and delay circuit 8 are operated, sequentially, in synchronization to a clock (not shown) of the code sequence R'. As described above, the timing when the syndromes $S_1$ and $S_3$ are outputted from the syndrome generators 1 and 2 is referred to as the first bit timing, and thereafter, a timing when a time interval of one clock has been passed from the first bit timing is referred to as the second bit timing. Similarly, a timing when a time interval of (n−1) clocks has been passed from the first bit timing is referred to as the n-th bit timing.

It is to be noted that the syndrome generators 1 and 2, the delay circuit 8 and the other circuits 3 to 10 which are provided in the BCH code decoder shown in FIG. 4 operate in synchronism to the clock (not shown) of the code sequence R'.

When data of zero are inputted to the syndrome generator 1 at the second bit timing, the syndrome generator 1 generates the syndrome $S_1 \alpha$ and outputs it. Thereafter, the syndrome generator 1 operates similarly, and then, generates at a k-th bit timing the following syndrome:

$$S_1 \alpha^{k-1} = (\alpha^{n-i} + \alpha^{n-j}) \cdot \alpha^{k-1} \qquad (12)$$
$$= \alpha^{n-1} \cdot (\alpha^{k-i} + \alpha^{k-j}),$$

and outputs it to the subtracter 3 and the non-zero detector 7.

On the other hand, when data of zero are inputted to the syndrome generator 2 at the second bit timing, the syndrome generator 2 generates the syndrome $S_2 \alpha^3$ and outputs it. Thereafter, the syndrome generator 2 operates similarly, and then, generates at a k-th bit timing the following syndrome:

$$S_3 \alpha^{3(k-1)} = (\alpha^{3(n-i)} + \alpha^{3(n-j)}) \cdot \alpha^{3(k-1)} \qquad (13)$$
$$= \alpha^{3(n-1)} \cdot (\alpha^{3(k-i)} + \alpha^{3(k-j)}),$$

and outputs it to the subtracter 4.

Further, the subtracter 3 subtracts $\alpha^{n-1}$ from the syndrome $S_{1,k}$ outputted from the syndrome generator 1, and then, outputs data $SS_1$ of the subtraction result thereof to a cube calculator 5. The cube calculator 5 calculates data SS1 cubed and outputs to a coincidence judgment circuit 6 the following code $P_1$ of the calculation result thereof:

$$P_1 = (S_1 \alpha^{k-1} - \alpha^{n-1})^3 \qquad (14)$$
$$= \alpha^{3(n-1)} \cdot (\alpha^{k-i} + \alpha^{k-j} - 1)^3$$
$$= \alpha^{3(n-1)} \cdot \{\alpha^{3(k-i)} + \alpha^{3(k-j)} - 1 +$$
$$(\alpha^{k-i} + \alpha^{k-j})(\alpha^{k-i} - 1)(\alpha^{k-j} - 1)\}.$$

The subtracter 4 subtracts $\alpha^{3(n-1)}$ from the syndrome $S_{3,k}$ outputted from the syndrome generator 2, and outputs to the coincidence judgment circuit 6 the following code $P_3$ of the subtraction result thereof:

$$P_3 = S_3 \alpha^{3(k-1)} - \alpha^{3(n-1)} \qquad (15)$$
$$= \alpha^{3(n-1)} \cdot \{\alpha^{3(k-i)} + \alpha^{3(k-j)} - 1\}.$$

Further, the coincidence circuit 6 compares the code $P_1$ with the code $P_3$, and then, if the code $P_1$ coincides with the code $P_3$, the coincidence judgment circuit 6 outputs a judgment signal $D_2$ having the high level to the second input terminal of an AND gate 10. Otherwise, the coincidence judgment circuit 6 outputs the judgment signal $D_2$ having the low level thereto. In this case, when $k=i$ and $k=j$, the code $P_1$ coincides with the code P3. Namely, at each of the i-th and j-th bit timings, the judgment signal $D_2$ having the high level is outputted.

The non-zero detector 7 is provided for judging whether or not the first syndrome $S_{1,k}$ is zero. At each of the first to the n-th bit timings, since the first syndrome $S_{1,k}$ is not zero, the non-zero detector 7 outputs a judgment signal $D_1$ having a high level to the first input terminal of the AND gate 10.

If the judgment signal $D_2$ having a high level is outputted from the coincidence judgment circuit 6 and the judgment signal $D_1$ having a high level is outputted from the non-zero detector 7, the AND gate 10 outputs an error correction signal having a high level to the second input terminal of the exclusive OR gate 9. Namely, at each of the i-th and j-th bit timings, the error correction signal having a high level is outputted from the AND gate 10 to the exclusive OR gate 9. Otherwise, the AND gate 10 outputs the error correction signal having a low level.

Further, the exclusive OR gate 9 calculates the exclusive logical sum of the signals inputted from the delay circuit 8 and the AND gate 10, namely inverts a bit inputted from the delay circuit 8 when the error correction signal becomes the high level.

Accordingly, at the i-th and j-th bit timings, the i-th bit $a_i'$ and the j-th bit $a_j'$ of the code sequence R' outputted from the delay circuit 8 are respectively inverted by the exclusive OR gate 9 in responsive to the error correction signal having a high level. As a result, bit errors of the i-th bit $a_1'$ and the j-th bit $a_j'$ are corrected, and then, the corrected i-th and j-th bits are outputted from the exclusive OR gate 9 to an output terminal 12. On the other hand, the bits other than the i-th and j-th bits are outputted without processing them. Accordingly, the corrected code sequence R without the error code E is outputted from the exclusive OR gate 9 to the output terminal 12.

In the above description, the action of the BCH code decoder shown in FIG. 4 when errors occur in the i-th and j-th bits among the code sequence R is described. However, when an error occurs in the i-th bit among the code sequence R', the syndromes $S_1$ and $S_3$ and the codes $P_1$ and $P_3$ are represented as follows:

$$S_1 = \alpha^{n-i} \tag{16}$$

$$S_3 = \alpha^{3(n-i)} \tag{17}$$

$$P_1 = \alpha^{3(n-1)} \cdot \{\alpha^{3(k-i)} - 1 - \alpha^{k-i}(\alpha^{k-i} - 1)\} \tag{18}$$

$$P_3 = \alpha^{3(n-1)} \cdot \{\alpha^{3(k-i)} - 1\} \tag{19}$$

Only at the i-th bit timing, the error correction signal having the high level is outputted from the AND gate 10 to the exclusive OR gate 9. Then, an error in the i-th bit among the code sequence R' is corrected.

Furthermore, in the case of no error among the code sequence R', the syndromes $S_1$ and $S_3$ and the codes $P_1$ and $P_3$ are as follows:

$$S_1 = 0 \tag{20}$$

$$S_3 = 0 \tag{21}$$

$$P_1 = -\alpha^{3(n-1)} \tag{22}$$

$$P_3 = -\alpha^{3(n-1)} \tag{23}$$

While the BCH code decoder shown in FIG. 4 performs the above-mentioned decoding process, since the code $P_1$ always coincides with the code $P_3$, the judgment signal $D_2$ having a high level is outputted from the coincidence judgment circuit 6 to the AND gate 10; however, the judgment signal $D_1$ having a low level is outputted from the non-zero detector 7 to the AND gate 10. Therefore, in this case the AND gate 10 outputs the error correction signal having a low level.

As described above, the BCH code decoder of the third preferred embodiment according to the present invention can correct bit error of two bits or less which may occur in the code sequence R' of the BCH code.

Respective concrete compositions of the syndrome generators 1 and 2, the subtracters 3 and 4 and the cube calculator 5 which are provided in the BCH code decoder for decoding the BCH (15, 7) code will be described below.

Figure 6:
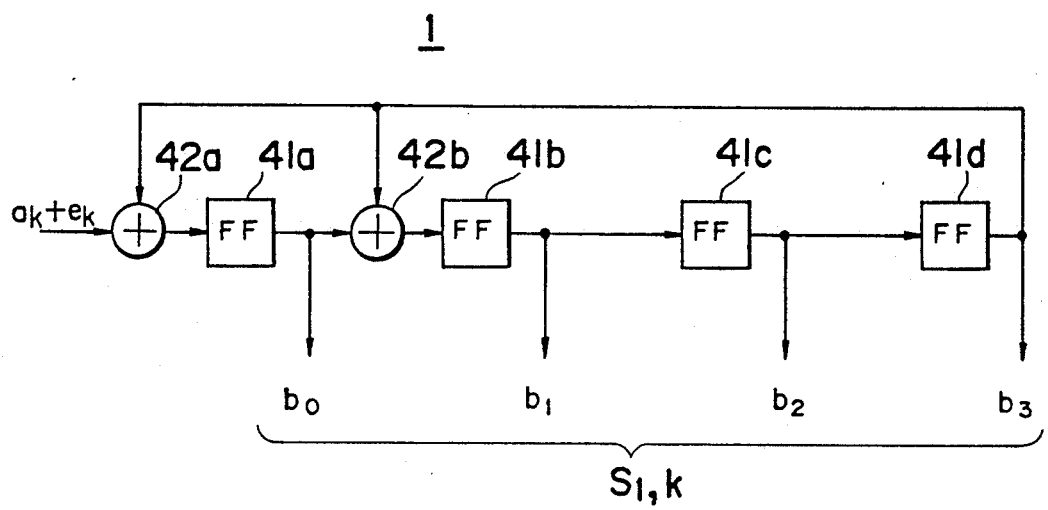
FIG. 6 is a block diagram showing a syndrome generator for generating first syndromes $S_{1,k}$ shown in FIGS. 4 and 5, which is provided in the BCH code decoder for decoding the BCH (15, 7) code.

FIG. 6 is a block diagram showing the syndrome generator 1 shown in FIG. 4, which is provided for generating the first syndrome $S_{1,k}$ based on the check matrixes $H_1$ from serial data $a_t + e_t$ of the error code sequence R'.

Referring to FIG. 6, the syndrome generator 1 comprises two exclusive OR gates 42a and 42b and four delay type flip flops 41a to 41d, wherein each of the exclusive OR gates 42a to 42b is an adder of modulo 2 as is well known in those skilled in the art. The serial data are inputted to the first input terminal of the exclusive OR fate 42a. The output terminal of the exclusive OR gate 42a is connected to the input terminal of the flip flop 41a, and the output terminal of the flip flop 41a is connected to the first input terminal of the exclusive OR gate 42b. The output terminal of the exclusive OR gate 42b is connected to the input terminal of the flip flop 41b. The flip flops 41b to 41d are connected in series. The output terminal of the flip flop 41d is connected to respective second input terminals of the exclusive OR gates 42a and 42b.

In the syndrome generator 1 constructed as described above, the first to the fourth bits $b_0$ to $b_3$ of the first syndrome $S_{1,k}$ in a k-th bit timing are outputted from respective output terminals of the flip flops 41a to 41d to the subtracter 3 and the non-zero detector 7.

Figure 7:
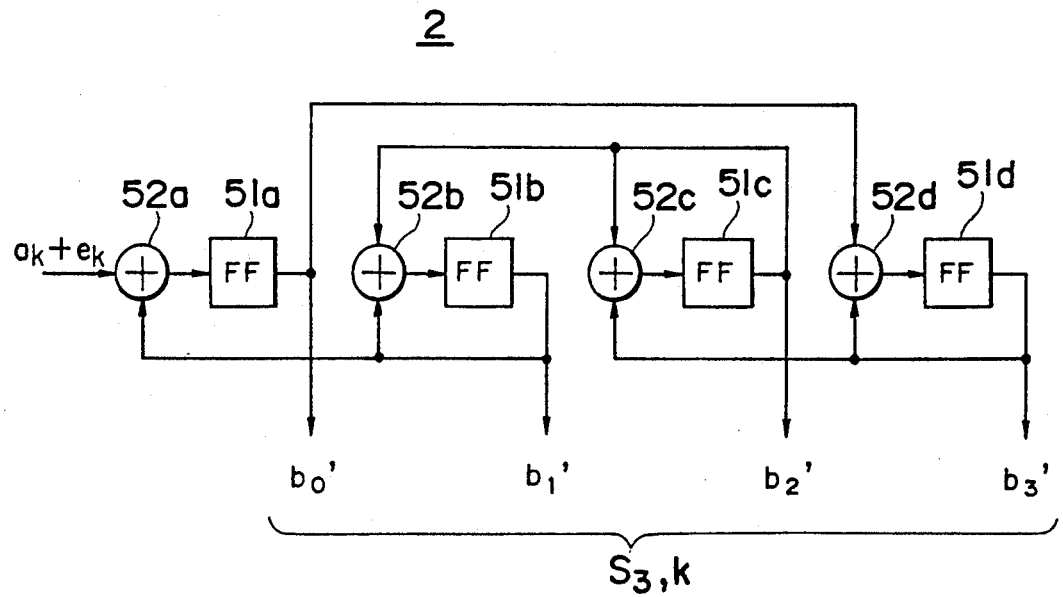
FIG. 7 is a block diagram showing a syndrome generator for generating second syndromes $S_{1,k}$ shown in FIGS. 4 and 5, which is provided in the BCH code decoder for decoding the BCH (15, 7) code.

FIG. 7 is a block diagram showing the syndrome generator 2 shown in FIG. 4, which is provided for generating the second syndrome $S_{3,k}$ based on the check matrixes $H_3$ form the inputted serial data $a_t + e_t$ of the error code sequence R'.

Referring to FIG. 7, the syndrome generator 2 comprises four exclusive OR gates 52a and 52d and four delay type flip flops 51a to 51d. The serial data are inputted to the first input terminal of the exclusive OR gate 52a, and the output terminal of the exclusive OR gate 52a is connected to the input terminal of the flip flop 51a. The output terminal of the flip flop 51a is connected to the first input terminal of the exclusive OR gate 52d. The output terminal of the exclusive OR gate 52d is connected to the input terminal of the flip flop 51d, and the output terminal of the flip flop 51d is connected to respective second input terminals of the exclusive OR gates 52c and 52d. The output terminal of the exclusive OR gate 52c is connected to the input terminal of the flip flop 51c, and the output terminal of the flip flop 51c is connected to respective first input terminals of the exclusive OR gates 52b and 52c. The output terminal of the exclusive OR gate 52b is connected to the input terminal of the flip flop 51b, and the output terminal of the flip flop 51b is connected to respective second input terminals of the exclusive OR gates 52a and 52b.

In the syndrome generator 2 constructed as described above, the first to the fourth bits $b_0'$ to $b_3'$ of the first syndrome $S_{3,k}$ in a k-th bit timing are outputted from respective output terminals of the flip flops 51a to 51d to the subtractor 4.

Figure 8:
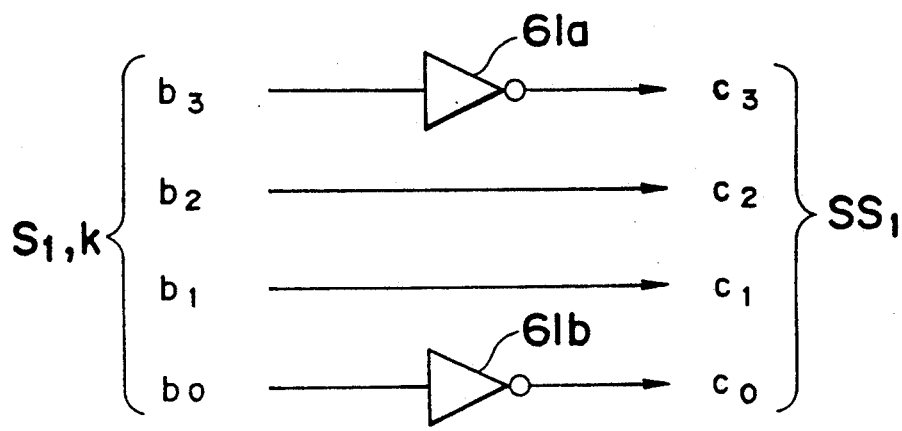
FIG. 8 is a block diagram showing a subtracter shown in FIGS. 4 and 5, which is provided in the BCH code decoder for decoding the BCH (15, 7) code.

FIG. 8 is a block diagram showing the subtractor 3 shown in FIG. 4, which is provided for subtracting $\alpha^{14}$ from the first syndrome $S_{1,k}$ inputted from the syndrome generator 1 shown in FIG. 4.

Referring to FIG. 8, the subtractor 3 comprises two inverters 61a and 61b. The bit $b_3$ of the first syndrome $S_{1,k}$ is inverted by the inverter 61a, and then, the inverted bit thereof is outputted as a bit $c_3$ of the data SS1 to the cube calculator 5. The bits $b_2$ and $b_1$ of the first syndrome $S_{1,k}$ are outputted as is as bits $c_2$ and $c_1$ of the data SS1 thereto, respectively. The bit $b_0$ of the first syndrome $S_{1,k}$ is inverted by the inverter 61b, and then, the inverted bit thereof is outputted as a bit $c_0$ of the data SS1 thereto.

Figure 9:
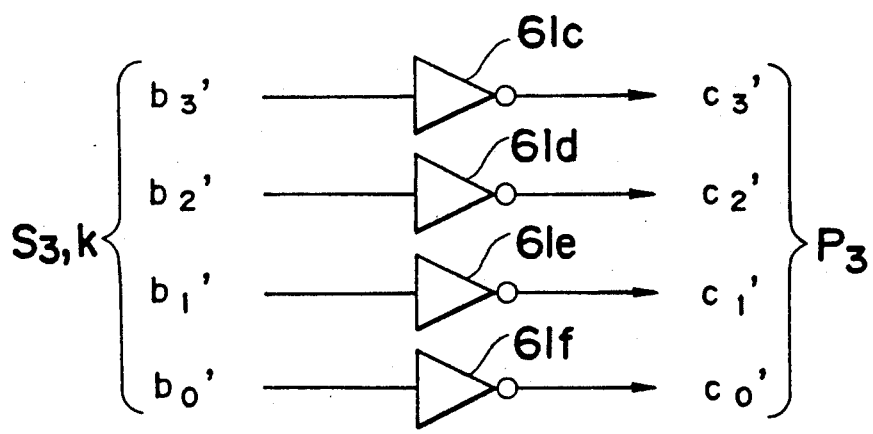
FIG. 9 is a block diagram showing each of another subtracter shown in FIG. 4 and an adder shown in FIG. 5, which are provided in the BCH code decoder for decoding the BCH (15, 7) code.

FIG. 9 is a block diagram showing the subtracter 4 shown in FIG. 4, which is provided for subtracting $\alpha^{3 \times 14}$ ($=\alpha^{42}=\alpha^{12}$) from the second syndrome $S_{3,k}$ inputted from the syndrome generator 2 shown in FIG. 4.

Referring to FIG. 9, the subtractor 4 comprises four inverters 61c to 61f. The bits $b_3'$ to $b_0'$ of the second syndrome $S_{3,k}$ are respectively inverted by the inverters 61c to 61f, and then, the inverted bits thereof are outputted as bits $c_3'$ to $c_0'$ of the code $P_3$ to the coincidence judgment circuit 6.

Furthermore, the cube calculator 5 calculates the results of the following logical operations:

$$d_3 = c_3 + c_3 \cdot c_2 + c_3 \cdot c_1 + c_2 + c_1 \quad (24a)$$

$$d_2 = c_3 \cdot c_2 + c_3 \cdot c_1 + c_3 \cdot c_0 + c_2 + c_2 \cdot c_1 + c_2 \cdot c_0 + c_1 \cdot c_0 \quad (24c)$$

$$d_1 = c_3 + c_3 \cdot c_2 + c_2 \cdot c_0 + c_1 \cdot c_0 \quad (24c)$$

$$d_0 = c_3 \cdot c_1 + c_2 \cdot c_1 + c_2 \cdot c_0 + c_0 \quad (24d)$$

from a matrix $\{c_3, c_2, c_1, c_0\}$ of the data $SS_1$ inputted from the subtracter 3, and outputs a matrix $[d_3, d_2, d_1, d_0]$ of the results thereof as the code $P_1$ to the coincidence judgment circuit 6.

In the above logical equations (24a) to (24d), $X \cdot Y$ means the logical product of X and Y, and $X+Y$ means the exclusive logical sum of X and Y. Further, the logical operations are performed with giving the priority to the operation of the logical product as compared with that of the exclusive logical sum.

The BCH code decoder comprising the syndrome generators 1 and 2 respectively shown in FIGS. 6 and 7, the subtracters 3 and 4 respectively shown in FIG. 8 and 9, and the cube calculator 7 as described above can be miniaturized, and the BCH code decoder capable of correcting two or less error bits can be fabricated using only the logical operation circuits.

(5) Fourth Preferred Embodiment

Figure 5:
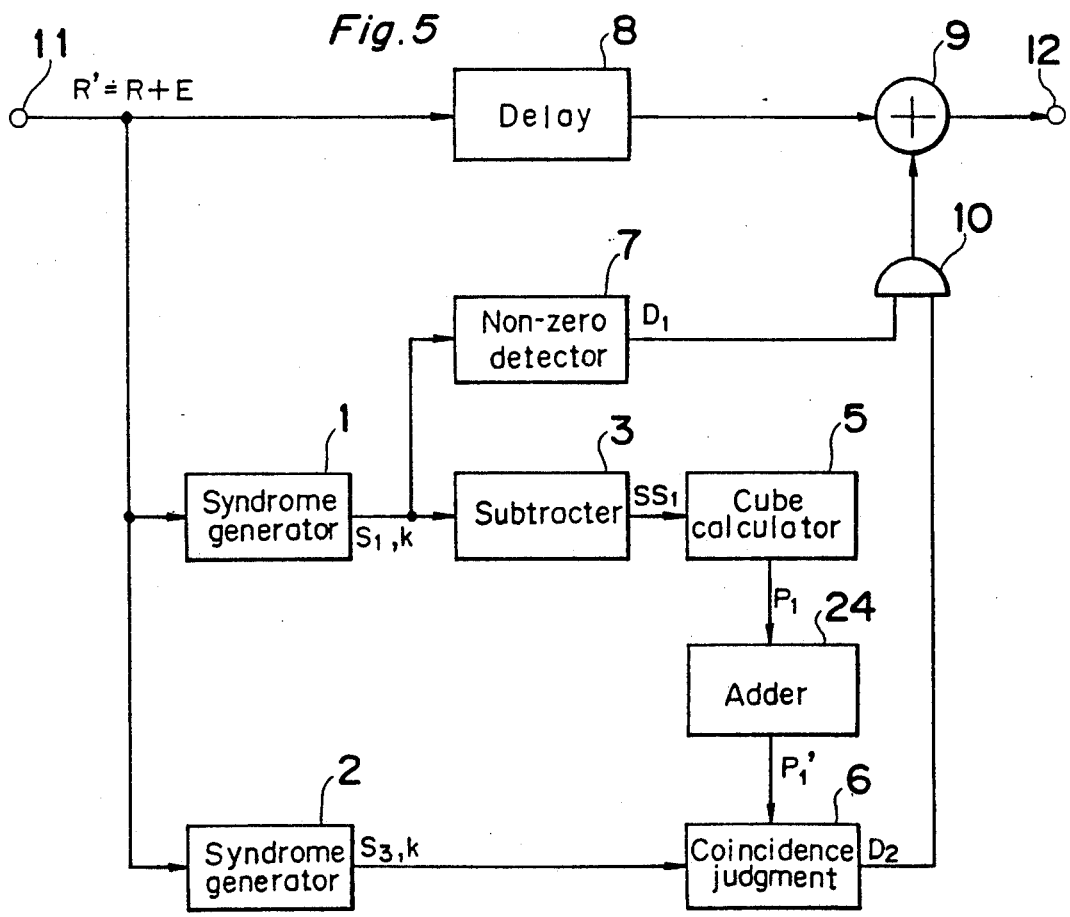
FIG. 5 is a block diagram showing a BCH code decoder in accordance with a fourth preferred embodiment of the present invention, which is capable of correcting two or less error bits occurring in a cod sequence encoded by a BCH encoding method.

FIG. 5 is a block diagram showing a BCH code decoder in accordance with the fourth preferred embodiment of the present invention, which is capable of correcting two or less error bits occurring in a code sequence encoded by a BCH encoding method. In FIG. 5, the components which are the same as those shown in FIG. 4 are denoted by the numerals which are the same as those shown in FIG. 4.

The differences between the BCH code decoder of the third and fourth preferred embodiments respectively shown in FIGS. 4 and 5 are that an adder 24 is provided between the cube calculator 5 and the coincidence judgment circuit 6 instead of the subtracter 4. The adder 24 is provided for adding $\alpha^{3(n-1)}$ to the data of the code $P_1$, and outputting the following code $P_1'$ of the addition result thereof to the coincidence judgment circuit 6:

$$\begin{aligned} P_1' &= \{S_1\alpha^{k-1} - \alpha^{n-1}\}^3 + \alpha^{3(n-1)} \\ &= \alpha^{3(n-1)} \cdot \{(\alpha^{k-i} + \alpha^{k-j} - 1)^3 + 1\} \\ &= \alpha^{3(n-1)} \cdot \{\alpha^{3(k-i)} + \alpha^{3(k-j)} + \\ &\quad (\alpha^{k-i} + \alpha^{k-j})(\alpha^{k-i} - 1)(\alpha^{k-j} - 1)\}. \end{aligned} \quad (25)$$

It is to be noted that $\alpha^{3(n-1)}$ to be added in the adder 24 corresponds to the second syndrome $S_{3,k}$ outputted when $e_1 = 1$, and the above value to be added is changed depending on the BCH code to be used.

It is to be noted that the following second syndrome $S_{3,k}$ which is outputted from the syndrome generator 2 is directly inputted to the coincidence judgment circuit 6:

$$S_3\alpha^{3(n-1)} \cdot \{\alpha^{3(k-i)} + \alpha^{3(k-j)}\} \quad (26).$$

When errors occur respectively in the i-th and j-th bits among the code sequence R, namely $e_i = 1$, $e_j = 1$ and $e_k = 0 (1 \leq k \leq n, k \neq i$ and $k \neq j)$, the code $P_1'$ coincides with the second syndrome $S_{3,k}$ when $k = i$ and $k = j$, the BCH code decoder of the fourth preferred embodiment shown in FIG. 5 can correct the error bits in a manner similar to that of the BCH code decoder of the third preferred embodiment shown in FIG. 4.

In the BCH code decoder of the fourth preferred embodiment for decoding the BCH (15, 7) code, since the addition operation over the Galois field GF ($2^4$) is the same as the subtraction operation thereover, the adder 24 has a composition which is the same as that of the subtracter 3.

In the fourth preferred embodiment as described above, the BCH code decoder can be miniaturized, and the BCH code decoder capable of correcting two or less error bits can be fabricated using only the logical operation circuits.

It is to be noted that the BCH code decoders of the first to the fourth preferred embodiments according to the present invention can be fabricated using a microprocessor unit and software.

It is understood that various other modifications will be apparent to and can be readily made by those skilled in the art without departing from the scope and spirit of the present invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which the present invention pertains.

What is claimed is:

1. A BCH code decoder for correcting a natural number N or less of error bits occurring in a code sequence composed of bits encoded by a BCH encoding method, comprising:

first to N-th syndrome generating means for respectively generating first to N-th syndromes from an inputted code sequence encoded by the BCH encoding method;

first to N-th subtracting means for respectively generating first to N-th check codes by subtracting predetermined syndromes to be calculated when an error occurs at a predetermined bit of said code sequence from said first to N-th syndromes generated by said first to N-th syndrome generating means;

a first error number judging means to judging a number of error bits represented by said first to N-th syndromes respectively generated by said first to N-th syndrome generating means, and for outputting a signal representing the judged number thereof;

a second error number judging means for judging a number of error bits represented by said first to N-th check codes respectively, generated by said first to N-th subtracting means, and for outputting a signal representing the judged number thereof;

an error number comparing means for generating an error correction signal when the judged number of said signal outputted from said first error number judging means is equal to the sum of one and the judged number of said signal outputted from said second error number judging means by comparing the judged number of said signal outputted from said first error number judging means with the judged number of said signal outputted from said second error number judging means;

a delay means for delaying said inputted code sequence by a predetermined delay time and for sequentially outputting a delayed code sequence; and an error bit correcting means for inverting each bit of said delayed code sequence outputted from said delay means and for outputting each inverted bit when said error correction signal is inputted from said error number comparing means and for outputting each bit of said delayed code sequence outputted from said delay means as is without inverting it when said error correction signal is not inputted from said error number comparing means, thereby outputting the decoded and corrected code sequence.

2. A BCH code decoder for correcting two or less error bits occurring in a code sequence composed of bits encoded by a BCH encoding method, comprising:

first and second syndrome generating means for respectively generating first and second syndromes from an inputted code sequence encoded by the BCH encoding method;

first and second subtracting means for respectively generating first and second subtraction codes by subtracting predetermined syndromes to be calculated when an error occurs at a predetermined bit of said code sequence from said first and second syndromes generated by said first and second syndrome generating means;

a non-zero detecting means for outputting a first judgment signal when at least one bit of said first syndrome generated by said first syndrome generating means is not zero in response to said first syndrome;

a cube calculating means for calculating the cube of said first subtraction code generated by said first subtracting means and for outputting a cubic code of the calculated cube of said first subtraction code;

a coincidence judgment means for outputting a second judgment signal when said cubic code outputted from said sube calculating means coincides with said second subtraction code outputted from said cube calculating means with said second subtraction code outputted from said second subtracting means;

a gate means for outputting an error correcting signal when said first judgment signal is outputted from said non-zero detecting means and said second judgment signal is outputted from said coincidence judgment means;

a delay means for delaying said inputted code sequence by a predetermined delay time and for sequentially outputting a delayed code sequence; and an error bit correcting means for inverting each bit of said delayed code sequence outputted from said delay means and for outputting each inverted bit when said error correction signal is inputted from said gate means and for outputting each bit of said delayed code sequence outputted from said delay means as is without inverting it when said error correction signal is not inputted from said gate, thereby outputting the decoded and corrected code sequence.

3. A BCH code decoder for correcting two or less error bits occurring in a code sequence composed of bits encoded by a BCH encoding method, comprising:

first and second syndrome generating means for respectively generating first and second syndromes from an inputted code sequence encoded by the BCH encoding method;

a first subtracting means for generating a first subtraction code by subtracting a predetermined syndrome to be calculated when an error occurs at a predetermined bit of said code sequence from said first syndrome generated by said first syndrome generating means;

a non-zero detecting means for outputting a first judgment signal when at least one bit of said first syndrome generated by said first syndrome generating means is not zero in response to said first syndrome;

a cube calculating means for calculating the cube of said first subtraction code generated by said first subtracting means and for outputting a cubic code of the calculated cube of said first subtraction code;

an adding means for adding a predetermined syndrome to be outputted from said second syndrome generating means when an error occurs at as predetermine bit of said code sequence, to said cubic code outputted from said cube calculating means, and for outputting an addition code of the addition result;

a coincidence judgment means for outputting a second judgment signal when said addition code outputted from said adding means coincides with said second syndrome outputted from said second syndrome generating means by comparing said addition code outputted from said adding means with said second syndrome outputted for said second syndrome generating means;

a gate means for outputting an error correcting signal when said first judgment signal is outputted from said non-zero detecting means and said second judgment signal is outputted from said coincidence judgment means;

a delay means for delaying said inputted code sequence by a predetermined delay time and for sequentially outputting a delayed code sequence; and an error bit correcting means for inverting each bit of said delayed code sequence outputted from said delay means and for outputting each inverted bit when said error correction signal is inputted from said gate means and for outputting each bit of said delayed code sequence outputted from said delay means as is without inverting it when said error correction signal is not inputted from said gate, thereby outputting the decoded and corrected code sequence.

4. A method for decoding a BCH code so as to correct a natural number N or less of error bits occurring in a code sequence composed of bits encoded by a BCH encoding method, including steps of:

respectively generating first to N-th syndromes from an inputted code sequence enclosed by the BCH encoding method;

respectively generating first to N-th check codes by subtracting predetermined syndromes to be calculated when an error occurs at a predetermined bit of said code sequence from said first to N-th syndromes;

generating error correction information when a number of error bits represented by aid first to N-th syndromes is equal to a sum obtained by adding one to a number of error bits represented by said first to N-th check codes; and correcting one or more error bits of said inputted code sequence according to said error correction information.

5. A method for decoding a BCH code so as to correct two or less error bits occurring in a code sequence composed of bits encoded by a BCH encoding method, including steps of:

respectively generating first and second syndromes from an inputted code sequence encoded by the BCH encoding method;

respectively generating first and second subtraction codes by subtracting predetermined syndromes to be calculated when an error occurs at a predetermined bit of said code sequence from said first and second syndromes;

generating error correction information when at least one bit of said first syndrome is not zero and a cube of said first subtraction code coincides with said second subtraction code; and correcting one or more error bits of said inputted code sequence according to said error correction information.

6. A method for decoding a BCH code so as to correct two or less error bits occurring in a code sequence composed of bits encoded by a BCH encoding method, including steps of:

respectively generating first and second syndromes from an inputted code sequence encoded by the BCH encoding method;

generating a first subtraction code by subtracting a predetermined syndrome to be calculated when an error occurs at a predetermined bit of said code sequence from said first syndrome;

generating a cubic code by cubing said first subtraction code;

generating an addition code by adding a predetermined second syndrome to be calculated when an error occurs at a predetermined bit of said code sequence to said cubic code;

generating error correction information, when at least one bit of said first syndrome is not zero and said addition code coincides with said second syndrome; and correcting one or more error bits of said inputted code sequence according to said error correction information.

* * * * *